Dec. 23, 1969 P. J. HAGON 3,484,933

FACE BONDING TECHNIQUE

Filed May 4, 1967 2 Sheets-Sheet 1

INVENTOR.
PETER J. HAGON

BY

Howard A. Silber

ATTORNEY

INVENTOR.
PETER J. HAGON
BY
Howard A. Silber
ATTORNEY

United States Patent Office 3,484,933

Patented Dec. 23, 1969

3,484,933

FACE BONDING TECHNIQUE

Peter J. Hagon, Corona Del Mar, Calif., assignor to North American Rockwell Corporation, a corporation of Delaware Filed May 4, 1967, Ser. No. 636,205

Int. Cl. B01j *17/00;* B23k *31/02*

U.S. Cl. 29—577 8 Claims

ABSTRACT OF THE DISCLOSURE

A process for face bonding a microcircuit chip to an interconnection substrate, thereby simultaneously forming electrical interconnections and a hermetic seal. Face bonding is accomplished by providing, on the chip and on the substrate, mating electrical interconnection islands surrounded by a sealing ridge. The islands and ridges each comprise silicon coated with a metal, preferably gold, which forms a low temperature eutectic with silicon. The chip is aligned face down on the substrate, and the mating pads and sealing ridges bonded by heating to above the metal-silicon eutectic temperature.

BACKGROUND OF THE INVENTION

Field of the invention

This invention relates to a technique for face bonding a chip containing a microelectronic circuit to an interconnection substrate. More particularly, the invention relates to a technique employing a low temperature metal-silicon eutectic to form electrical connections between the chip and the substrate, and simultaneously to hermetically seal the circuit.

Description of the prior art

Electronic microcircuits have become more and more complex, often containing hundreds of components on a single integrated circuit chip. Interconnecting such microcircuit chips has become an increasingly difficult problem, with ever larger numbers of connections required in smaller and smaller areas. Techniques wherein individual circuit chips are packaged in a ceramic flat pack and wire leads thermocompression bonded to each connector pad on the chip no longer are practical. Rather, thin film electrical interconnection patterns are prepared on an electrically insulating substrate. All electrical interconnections then are made simultaneously by face bonding each chip directly to the interconnection substrate.

Various techniques for face bonding microcircuit chips to an interconnection substrate are reviewed, e.g., in the article by George Sideris, entitled, "Bumps and Balls, Pillars and Beams: A Survey of Face Bonding Methods," published in Electronics Magazine, June 28, 1965, beginning on page 68. In general, the prior art face bonding techniques require that each electrical contact pad on a chip be provided with a ball, a bump, or a beam, that is, with an individual metalized member which projects from the surface of the chip. The chip is flipped, i.e., placed face down in aligned engagement with the substrate, and the bumps soldered or welded to mating pads on the interconnection substrate.

Numerous problems have been encountered with these prior art bonding techniques. For example, there is the basic problem of how to attach the metal balls or bumps to the microcircuit. In one technique, the chip first must be covered with a protective glass layer, holes etched in the glass to expose the chip electrical terminals, and solder flowed into the holes to form the balls. Alternatively, bumps may be welded ultrasonically, one at a time, to pads on the chip. Additional problems are encountered when the chip is inverted and connected to the substrate. For example, if solder balls are subjected to excess pressure, the solder spreads, occasionally short-circuiting adjacent pad areas. This severely limits how closely adjacent connection pads may be situated. Further, the balls, bumps, or beams sometimes require metals which, when heated to temperatures sufficient to form the interconnects, introduce impurities which degrade performance of the microcircuit.

Other disadvantages also are experienced with prior art face bonding techniques. For example, the bumps, beams, or balls must be provided by techniques not compatible with normal fabrication of the microcircuit itself. Further, additional steps must be taken, such as embedding the chip in a potting compound, to provide a hermetic seal.

The present invention provides a technique for face bonding a microelectronics circuit chip to an interconnection substrate using interconnection islands which may be formed simultaneous with fabrication of the circuit. The technique, which employs low temperature eutectic bonds, simultaneously provides a hermetic seal for the microcircuit, thus eliminating an additional packaging step. Further, the technique uses materials which do not introduce undesirable impurities into the device.

SUMMARY OF THE INVENTION

The present invention provides a technique for face bonding a microcircuit chip to an interconnection substrate while simultaneously providing a hermetic seal for the circuit. All electrical interconnections to be made with the substrate are terminated in a region which is surrounded by a metal-coated silicon sealing ridge. Inside the ridge, electrical connections from the various circuit components terminate in metal-coated silicon islands, the top surfaces of which are coplanar with the sealing ridges. Corresponding sealing ridge and interconnection islands are provided on the interconnection substrate. The chip is placed face down onto the interconnection substrate with the pads and ridges in mating engagement, and the combination heated sufficiently to form a metal-silicon eutectic. The eutectic-bonded islands thus formed provide electrical interconnections between the chip and the interconnection substrate, while the bonded ridges hermetically seal the chip and its circuit.

It is thus an object of the present invention to provide a technique for face bonding a microelectronic chip to an interconnection substrate.

It is another object of the present invention to provide a microcircuit face bonding technique which simultaneously provides electrical interconnections and hermetic sealing of the microcircuits.

Yet another object of the present invention is to provide a technique for face bonding a microcircuit to an interconnection substrate by forming a silicon-metal eutectic at the interface.

A further object of the present invention is to provide a face bonded microcircuit wherein a hermetic seal surrounding the interconnections is formed simultaneously therewith.

A still further object of the present invention is to provide a system for interconnecting microelectronic circuit chips by using silicon-metal eutectic bonds to provide electrical connections between mating pads on an interconnection substrate and individual chips.

BRIEF DESCRIPTION OF THE DRAWINGS

These and other objects of the invention will become apparent from the following description taken in connection with the accompanying drawings in which.

DESCRIPTION OF THE PREFERRED EMBODIMENT

Figure 1:
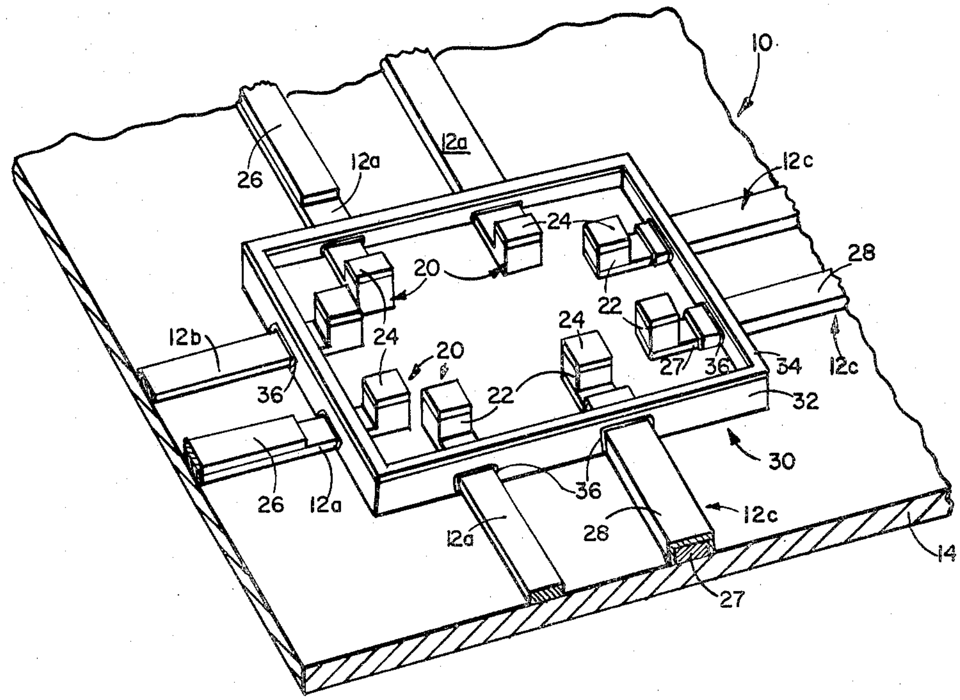
FIG. 1 is a perspective view of a portion of an interconnection substrate including a sealing ridge and interconnection islands adapted for metal-silicon eutectic bonding to a microelectronic circuit chip, in accordance with the present invention.

Referring now to FIG. 1, there is shown a region of a typical interconnection substrate 10 which may be used to provide electrical connections between various integrated microcircuit chips. The region shown is adapted to receive a single chip (not shown) and contains interconnection islands 20 disposed in a pattern corresponding to electrical contact pads on the chip. Surrounding islands 20 is sealing ridge 30 which, when bonded to a corresponding ridge on the chip, forms a hermetic seal.

Interconnection substrate 10 itself comprises a base 14 of an electrically insulating material such as sapphire, MgO, BeO, spinel, alumina, ceramic, or quartz. Base 14 may be single crystal, polycrystalline, or amorphous. Alternately, base 14 could be made of a conducting material such as molybdenum, tungsten, or Kovar, with a layer of electrically insulating material securely bonded to its surface. In a preferred embodiment, base 14 is of a transparent or semi-transparent material, to allow optical alignment of the chips during the face bonding process. However, it is not imperative that base 14 be transparent, as individual chips themselves may be sufficiently transparent to permit alignment.

Disposed on the surface of base 14 are a plurality of electrical conductors 12*a*, 12*b*, and 12*c*. As shown most clearly in FIG. 3, conductors 12 are arranged to provide the desired electrical connections between the microcircuits on the various chips 16 which are bonded to interconnection substrate 10. The pattern of conductors 12 may include crossovers 18 where conductors 12 pass underneath, and are electrically insulated from conductor 12′.

Electrical conductors 12 may be of various types. For example, conductors 12*a* (see FIG. 1) may comprise low resistivity silicon, epitaxially grown or vapor deposited onto base 14, then selectively etched away into the desired pattern. In regions outside of sealing ridge 30, silicon conductors 12*a* may be coated with a layer 26 of high conductivity metal such as aluminum or copper to reduce conductor resistance. Alternatively, conductor 12*b* may be of metal such as aluminum, gold, tungsten, etc., deposited on the surface of base 14, e.g., by vacuum evaporation through an appropriate mask.

In another embodiment, also illustrated in FIG. 1, conductor 12*c* comprises an underlay 27 of a metal such as molybdenum or tungsten which may oxidize in air or a water vapor atmosphere. Over this is a protective conductive coating 28 of another metal such as gold which does not so oxidize. The function of coating 28 will be discussed more thoroughly hereinbelow.

Referring still to FIG. 1, in accordance with the present invention, conductors 12 terminate at interconnection islands 20 which are located to correspond with appropriate electrical connection pads on the chip 16 to be bonded at this location on interconnection substrate 10. Islands 20 each comprise a layer of silicon 22 atop which is a film 24 of metal. In a preferred embodiment, the top surfaces of metal films 24 on each of islands 20 are coplanar. As explained below, the metal used for film 24 is one which forms a relatively low temperature eutectic with silicon.

Hermetic sealing ridge 30 comprises silicon portion 32, the top of which is coated with a film 34 of the same metal used for film 24 on islands 20. Preferably, the top surface of film 24 is coplanar with the top of islands 20. Silicon ridge portion 32 is electrically isolated from conductors 12 which pass therethrough by insulating layer 36, which, e.g., may be of $SiO_2$ or $Si_2N_3$.

The silicon portions 22 of interconnection islands 20 may be provided by any technique well known to those skilled in the art. For example, should sapphire be used for base 14, a layer of silicon initially may be grown epitaxially on base 14 in accordance with the process described in copending application to Harold M. Manasevit et al., Ser. No. 403,439, entitled "Single Crystalline Silicon on Insulating Substrates," assigned to North American Aviation, Inc., assignee of the present application. Selective etching then may be used to define simultaneously silicon conductors 12*a* and the silicon portions 22 adjacent thereto. Alternately, the silicon may be provided by other techniques such as vapor deposition, atop the previously vacuum operated metal conductors 12*b* or 12*c*.

The silicon employed for islands 20 preferably has low resistivity, in the order of 0.001 ohm centimeter, and may be doped, as with phosphorous. Silicon layer 22 may be either single crystal or polycrystalline.

Electrical insulating layer 36 may be provided over silicon conductors 12*a* by thermal oxidation of the silicon in an oxygen or water vapor atmosphere. Insulating layer 36 of $SiO_2$ or $Si_2N_3$ may be provided over metal conductors 12*b* or 12*c* by chemical vapor-phase deposition. Of course, other dielectrics may be used for layer 36.

Silicon region 32 of sealing ridge 30 may be provided on interconnection substrate 10 by vapor-phase deposition, evaporation, sputtering, or other techniques. The silicon, as in regions 22, may be either single crystal or polycrystalline; however, since silicon region 32 is not being used as an electrical conductor, there is no requirement that it be of low resistivity.

Metal films 24 (on islands 20) and 34 (on sealing ridge 32) may be produced by chemical vapor-phase deposition, vacuum evaporation, sputtering, or other appropriate technique. It has been found that a thickness for metal coatings 24 and 34 on the order of 0.5 to 1 micron is sufficient for excellent electrical contact to islands 20 and also is sufficient to provide a hermetic seal including ridge 30.

The metal selected for films 24 and 34 should be one which forms a low temperature eutectic with silicon. Gold is an example of such a metal; as shown at point 39 in the metal phase diagram of FIG. 4, gold forms a eutectic with silicon at a temperature of about 385° C. with a composition of about 31% silicon and 69% gold. Note that this eutectic temperature is considerably lower than the melting temperature of either pure gold (1063° C.) or pure silicon (1404° C.)

Other metals which may be used for films 24 and 34 include, but are not limited to, aluminum, silver, platinum, antimony, magnesium, copper, leads, and nickel. The silicon eutectic temperatures for each of these metals is given in the following table.

TABLE I

| Eutectic material | Eutectic temperature, ° C. |
|---|---|
| Silicon-aluminum | 577 |
| Silicon-silver | 830 |
| Silicon-platinum | 830 |
| Silicon-antimony | 630 |
| Silicon-magnesium | 637 |
| Silicon-copper | 800–820 |
| Silicon-lead | 720–850 |
| Silicon-nickel | 700 |

Figure 2:
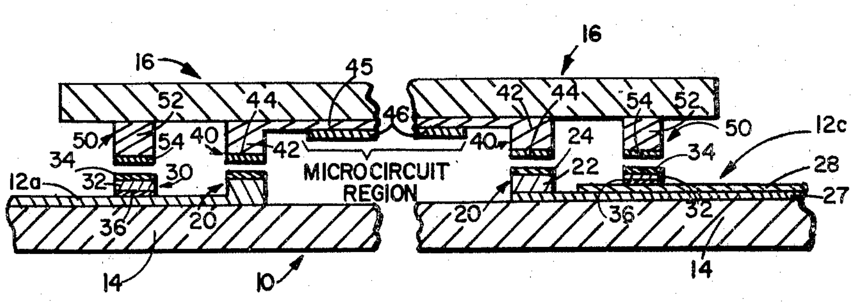
FIG. 2 is a cross-sectional view showing a typical microelectronic chip just prior to eutectic face bonding to mating pads and a mating sealing ridge on an interconnection substrate such as that illustrated in FIG. 1.
Figures 4, 5:
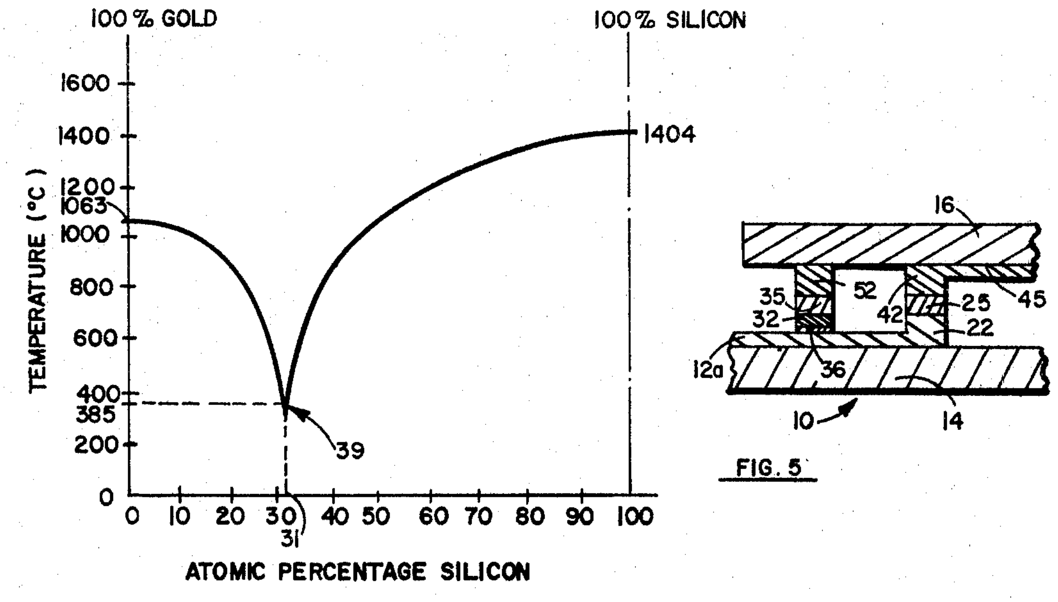
FIG. 4 is a metal phase diagram for a silicon-gold eutectic.
FIG. 5 is a fragmentary sectional view showing a microelectronic circuit chip metal-silicon eutectic face bonded to an interconnection substrate such as that shown in FIG. 1.

The manner in which the bond is achieved between interconnection substrate 10 (see FIG. 1) and a microelectronic circuit chip 16 is illustrated in FIGS. 2 and 5. It should be clear that each chip 16 which is to be bonded to substrate 10 itself should be provided with interconnection islands 40 and a sealing ridge 50 which may be identical, respectively, to islands 20 and ridge 30 (on substrate 10). In particular, typical island 40 on chip 16 comprises silicon layer 42 and metal film 44; island 40 is located to mate with corresponding island 20 on substrate 10, and preferably utilizes the same metal for film 44 as for film 24. Similarly, sealing ridge 50 on chip 16 comprises semiconductor layer 52 (preferably silicon) and metal film 54; ridge 50 is disposed for mating engagement with corresponding ridge 30 on substrate 10, and preferably utilizes the same metal for film 54 as for film 34.

Face bonding of typical chip 16 to interconnection substrate 10 is accomplished by optically aligning the mating islands 20 and 40 and the mating ridges 30 and 50 (e.g., by viewing the locations of these items through the transparent substrate or chip), and lowering chip 16 into mating engagement with substrate 10. The combination then is heated to a temperature above the eutectic temperature of the silicon-metal combination used. For example, if gold is used for films 24, 34, 44, and 54, the combination should be heated to a temperature above the 385° C. silicon-gold eutectic temperature (see FIG. 4) but below the melting temperature of either gold (1063° C.) or silicon (1404° C.).

As shown in FIG. 5, this heating causes a eutectic 25 to be formed which interconnects island 20 to island 40, the eutectic combining silicon from layers 22 and 42 with metal from layers 24 and 44. Eutectic bond region 25 provides an excellent electrical path between conductor **12*a* on substrate 10 and conductor 45 on chip 16. At the same time, eutectic bond 35 is formed between sealing ridge 30 on substrate 10 and ridge 50 on chip 16. Eutectic 35 combines silicon from layers 32 and 52 with metal from films 34 and 54. The resultant eutectically bonded ridges 30 and 50 provide a hermetic seal for microcircuit region 46 (not shown in FIG. 5 but evident in FIG. 2) of chip 16**.

As just indicated, when eutectic regions 25 and 35 are formed, silicon from the layers 22 and 42 (in islands 20 and 40) and regions 32 and 52 (in ridges 30 and 50) is combined into the eutectic. Reference to the appropriate phase diagram, such as that shown for silicon-gold in FIG. 4, provides an indication of the minimum required thickness of silicon layers 22, 32, 42, and 52. For example, if gold is used for films 24, 34, 44, and 54, and each of these films is 1 micron thick, then silicon layers 22, 32, 42 and 52 each must be at least (1 micron)$\times$(31/69)=0.45 micron thick. The ratio 31/69 represents the relative percentages of silicon and gold (respectively) in the silicon-gold eutectic. It is undesirable to make layers 22, 32, 42, and 52 considerably thicker than this minimum dimension, since a large excess of silicon may result in the formation of blobs or globules of a eutectic-silicon mixture, with concomitantly poor bonding between chip 16 and interconnection substrate 10.

The eutectic face bonding preferably should be achieved in atmosphere which will not cause oxidation of the materials used for conductors **12*b* and 12*c* and for metal films 24, 34, 44, and 54. For example, if gold (which does not oxidize in air) is used for these conductors and films, it is possible to achieve satisfactory eutectic sealing and electrical interconnections in an ordinary air atmosphere. On the other hand, should aluminum be used for films 24, 34, 44, and 54, it may be desirable to carry out the face bonding operation in an inert or reducing atmosphere to insure that the aluminum is not oxidized during the eutectic forming step. This may be accomplished by placing interconnection substrate 10 and chip 16 in a chamber containing an inert atmosphere (e.g. of argon or nitrogen) or, alternatively, in a chamber through which is flowing hydrogen or other forming gas. Substrate 10 and chip 16** then may be aligned and heated inside the chamber to form a eutectically bonded structure, free of undesired oxides. The structure so formed has the added advantage that the atmosphere within its hermetically sealed region comprises an inert or reducing gas.

Figure 3:
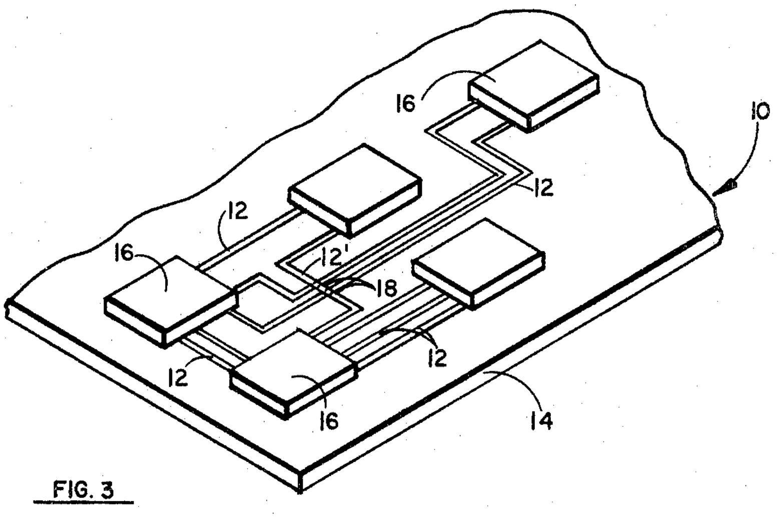
FIG. 3 shows a perspective view of a typical interconnection substrate to which several microcircuit chips have been face bonded in accordance with the present invention.

It is apparent that when a plurality of chips 16 are eutectically bonded in the manner described herein to interconnection substrate 10, the completed product has the overall appearance shown in FIG. 3. The package provides multiple interconnections 12 between the various microcircuit chips 16 in a minimum of space, and eliminates completely the need for attaching leads one at a time to individual pads on the circuits. Moreover the combination needs no additional potting or packaging, since the microcircuit regions 46 of each chip 16 is hermetically sealed.

While the foregoing discussion has referred to silicon as the material for regions 22, 32, 42, and 52, it should be obvious that the invention is not so limited. Other materials (such as germanium) could be used provided that the metal selected for films 24, 34, 44, and 54 forms a low temperature eutectic with the material used for regions 22, 32, 42, and 52. Moreover, it should be understood that other variations are within the scope of this invention. For example, films 22 and 42 (alternately, films 32 and 52) could be omitted and films 32 and 52 (alternately, films 22 and 42) made of sufficient thickness to provide the metal required to form eutectic bond regions 25 and 35. In another embodiment, the ridges and interconnection islands on one of chip 16 or substrate 10 may be all metal, with the ridges and islands on the other all silicon. When face bonded, the eutectic would be formed between the abutting metal and silicon regions.

Although the invention has been described in detail, it is to be understood that the same is by way of illustration and example only, and is not to be taken by way of limitation, the spirit and scope of the invention being limited only by the terms of the appended claims.

I claim:

1. A process for face bonding a hermetically sealed microcircuit chip to an interconnection substrate comprising the steps of:

(a) providing corresponding interconnection islands on said chip and said substrate, said islands comprising a layer of semiconductor material and a film of metal atop said layer, said metal being eutectically soluble in said material;

(b) providing said chip and said substrate with a corresponding sealing ridge surrounding said islands, said ridge comprising a region of said semiconductor material and a film of said eutectically soluble metal atop said region, and (c) heating said chip and said substrate, with said islands and said ridge in mating engagement, to a temperature above the eutectic temperature of said material and said metal.

2. The process defined in claim 1 wherein said material comprises silicon.

3. The process defined in claim 2 wherein said metal comprises gold.

4. The process defined in claim 1 wherein said material comprises silicon and wherein said metal is selected from the class consisting of aluminum, silver, platinum, antimony, magnesium, copper, lead, nickel and gold.

5. The process defined in claim 4 wherein said film has a thickness of between 0.5 and 1 micron.

6. The process defined in claim 5 wherein the thickness of said material layer is related to the thickness of said metal film in proportion to said material to said metal in a eutectic of said metal and said material.

7. The process defined in claim 4 wherein said substrate comprises a base of single crystal, electrically insulating material.

8. A process for face bonding a hermetically sealed microcircuit chip to an interconnection substrate comprising the steps of:

(a) providing corresponding interconnection islands on said chip and said substrate, said islands comprising a layer of semiconductor material and a film of metal atop said layer said metal being eutectically soluble in said material;

(b) providing said chip and said substrate with a corresponding sealing ridge surrounding said islands, said ridge comprising a region of said semoconductor material and a film of said eutectically soluble metal atop said region;

(c) providing a layer of insulation between conductors on said substrate and said sealing ridge; and (d) heating said chip and said substrate with said islands and said ridge in mating engagement to a temperature above the eutectic temperature of said material and said metal.

References Cited

UNITED STATES PATENTS

| | | | |
|---|---|---|---|
| 3,349,481 | 10/1967 | Karp | 29—627 |
| 3,371,148 | 2/1968 | Roques et al. | 29—577 X |
| 3,373,481 | 3/1968 | Lins et al. | 29—577 X |

JOHN F. CAMPBELL, Primary Examiner

V. A. DI PALMA, Assistant Examiner

U.S. Cl. X.R.

29—580